(12) United States Patent
Yokose

(10) Patent No.: US 6,188,338 B1
(45) Date of Patent: Feb. 13, 2001

(54) CODING APPARATUS, DECODING APPARATUS AND METHODS APPLIED THERETO

(75) Inventor: Taro Yokose, Nakai-machi (JP)

(73) Assignee: Fuji Xerox Co., Ltd., Tokyo (JP)

( * ) Notice: Under 35 U.S.C. 154(b), the term of this patent shall be extended for 0 days.

(21) Appl. No.: 09/301,552

(22) Filed: Apr. 29, 1999

(30) Foreign Application Priority Data

May 27, 1998 (JP) .................................................. 10-145370

(51) Int. Cl.[7] ....................................................... H03M 7/40
(52) U.S. Cl. ................................................. 341/65; 341/67
(58) Field of Search ................................... 341/51, 65, 67

(56) References Cited

U.S. PATENT DOCUMENTS 5,440,404 * 8/1995 Okamoto ................................. 341/67
5,510,785 * 4/1996 Segawa et al. ......................... 341/67

FOREIGN PATENT DOCUMENTS 63-232626 9/1988 (JP) .
7-7436 1/1995 (JP) .

* cited by examiner

Primary Examiner—Jon Santamauro
(74) Attorney, Agent, or Firm—Oliff & Berridge, PLC

(57) ABSTRACT

A coding apparatus and decoding apparatus for easily generating an adaptive Huffman code. A frequency counting element possesses a counter that counts the appearance frequency of a preset dominant symbol candidate included in an input data. A dominant symbol selecting unit selects from a frequency data, data having a larger frequency than a predetermined threshold value and sends the selected data to a code assigning element as a dominant symbol frequency data. A fixed code word memory stores a previously generated Huffman code and sends it to the code assigning element as a fixed code word data. The code assigning element generates a Huffman code for the dominant symbol and synthesizes the Huffman code and the fixed code word data stored in the fixed code word memory to obtain the Huffman code for the whole data. The input data is coded using the Huffman code and an intermediate symbol data. The intermediate symbol data and a Huffman code table data are sent in a coded state. Coded data may, likewise, be decoded.

14 Claims, 14 Drawing Sheets

FIG.4(b)

CORRESPONDING CODE TABLE

| CODE TABLE DATA | INPUT 1 | INPUT 2 | ... | INPUT N | INTERMEDIATE SYMBOL 1 | ... | INTERMEDIATE SYMBOL M |
|---|---|---|---|---|---|---|---|
| 1 | 00000 | 00001 | ... | 01111 | 100 | ... | 1111 |
| 2 | 00000 | 00001 | ... | 01111 | 10 | ... | — |
| ... | | | | ... | | ... | |
| L | 000000 | 000001 | ... | 001111 | 01 | ... | — |

FIG.4(c)

CODE TABLE DATA | INPUT 3 | INPUT 7 | INPUT 8 | INTERMEDIATE SYMBOL DATA | INPUT DATA | ...

FIG.4(d)

CODE TABLE DATA | INPUT 3 | INPUT 7 | INPUT 8 | ... | INPUT 8 | INTERMEDIATE SYMBOL DATA | INPUT 8 | INPUT DATA | ...

DUMMIES

FIG.5

| INTERMEDIATE SYMBOL | INPUT SYMBOL |
|---|---|
| 1 | INPUT 3 |
| 2 | INPUT 7 |
| 3 | INPUT 8 |
| 4 | — |
| ⋮ | ⋮ |
| M | — |

FIG.8(PRIOR ART)

| SYMBOL | APPERANCE FREQUENCY | HUFFMAN CODE EXAMPLE |
|--------|---------------------|----------------------|
| A | 0.50 | 0 |
| B | 0.30 | 10 |
| C | 0.15 | 110 |
| D | 0.05 | 111 |

CODING APPARATUS, DECODING APPARATUS AND METHODS APPLIED THERETO

BACKGROUND OF THE INVENTION

1. Field of the Invention

The present invention relates to a technique for data compression, and more particularly to a technique for data compression using Huffman coding.

2. Discussion of the Related Art

Generally, when communicating or storing data, data quantity can be reduced using data compression techniques. Huffman coding is a typical example of such data compression technique.

The Huffman code is a publicly known technique discussed in "Document Data Compression Algorithm Guide", Uematsu, CQ Publishing Company, pp. 46–51, for example. Roughly speaking, in Huffman coding, data is compressed by assigning a short code to frequently generated symbols and a long code to symbols that are only occasionally generated. An example of Huffman code is shown in FIG. 8.

The following are the two essential conditions for rendering Huffman codes effective:

(1) the appearance probability of each symbol is already known; and (2) the appearance probability of each symbol is stationary. Condition (1) is based upon the fact that the generation of Huffman codes depends on the appearance probability of each symbol, and condition (2) is based upon the fact that Huffman coding uses a fixed code table. However, since it is necessary to perform a statistical process on the input data before coding in order to satisfy condition (1), the processing load becomes heavy. Also, condition (2) cannot be satisfied by general data.

In view of the above circumstances, a technique to update Huffman codes at appropriate intervals has been suggested, as is disclosed by Japanese Laid-Open Patent Application No. 7-7436, for example. With this method, condition (1) becomes unnecessary since codes are designed according to the statistics of the data coded immediately before. As for condition (2), a moderate variation is allowed since the optimum code is used at every updating interval. FIGS. 9 and 11 are block diagrams respectively illustrating a coding apparatus and a decoding apparatus of the prior art.

As shown in FIG. 9, a data inputting unit 10 sends an input data 100 to a frequency counting unit 20. The frequency counting unit 20 counts the appearance frequency of symbols contained in the input data 100 and outputs the result to a code assigning unit 40 as a frequency data 110. The code assigning unit 40 generates a code word data 141 based upon the frequency data 110 and stores it in a code word memory 60. A Huffman coder 70 performs a Huffman coding upon the input data 100 using the code word data 141, and sends the resulting data to a code outputting unit 80 as a code data 151. The code data outputting unit 80 outputs the code data 151.

In FIG. 11, the parts similar to those in FIG.9 have the same reference numbers and perform the same functions, and therefore are not discussed in detail.

A code data inputting unit 15 sends the code data 151 to a Huffman decoder 75. The Huffman decoder 75 performs a Huffman decoding upon the code data 151 using the code word data 141, and outputs the result to a data outputting unit 85 as the input data 100. The data outputting unit 85 outputs the input data 100 to an external device.

FIGS. 10 and 12 are flow charts respectively illustrating the coding and decoding operations of the prior art.

As shown in FIG. 10, in step 10, the frequency counting unit 20 counts each type of symbols contained in the input data 100 to obtain the frequency data 110. In step 211, it is determined whether the frequency data 110 satisfies a predetermined condition for the process of updating the code table at that time. If it does, the process proceeds to step 212, and to step 30 if not. In step 212, the code assigning unit 40 generates the Huffman code based upon the frequency data 110 to obtain the code word data 141. In step 30, the Huffman coder 70 performs a Huffman coding upon the input data 100 using the code word data 141. In step 40, it is determined whether any unprocessed input data 100 remains. The coding process is complete if there is no unprocessed input data 100 remaining. Otherwise, the process returns to step 10.

In FIG. 12, the processes similar to those in FIG. 10 have the same reference numbers and perform the same functions, and therefore are not discussed in detail.

In the above, the codes have the same initial value in the coding and decoding processes. General purpose codes or specially designed codes may also be used as input data. In the latter case, it is necessary to identify the code table to the decoding side by assigning the code table to the header of the code data.

The conditions for updating the code table in step 211 are arbitrary. Japanese Laid-Open Patent Application No. 7-7436, for example, is suggested particularly for application to moving image data, and the code table is updated for every frame.

The Huffman code generating algorithm in step 212 is publicly known and is discussed in "Document Data Compression Algorithm Guide", Uematsu, CQ Publishing Company, for example, and therefore is not discussed here in detail. Generally, in a Huffman code generating algorithm, symbols are sorted by their appearance probabilities. Two symbols having low probabilities are combined to generate a new symbol. This process is repeated while codes are assigned to the symbols.

In the above discussed method, it is preferred that the code table be updated for every unit in which the distribution of the appearance probabilities of the input symbols is stationary. Therefore, updating intervals are preferred to be as short as possible, as long as sufficient statistics for presuming the distribution of the appearance probabilities of each symbol can be obtained. If the conditions are applied to static image data, similarities among the distribution of the appearance probabilities of each symbol cannot be expected, and therefore it becomes effective to update the code table within an image data.

The Huffman code generation of step 212 frequently uses a sorting process, and therefore shortening the updating intervals of the code table leads to an increase in the process load of the coding process.

A method disclosed by Japanese Laid-Open Patent Application No. 63-232626 aims to solve the above problem by generating a simplified Huffman code by rearranging the symbols in the appearance probability order and writing them in the code table prepared in advance. With this method, the process load of Huffman code generation is reduced since the sorting process is required only once.

The problem with this method, however, is that an efficient reduction of the code quantity is not assured. Even when the symbols are sorted in the appearance probability order, there are many possible distribution patterns of the appearance probabilities, and there is no assurance that the optimum codes will be generated.

SUMMARY OF THE INVENTION

The present invention has been made in view of the above circumstances and with an aspect to provide a coding method for easily generating an adaptive compressed code such as a Huffman code. Furthermore, the present invention has an aspect to provide an optimum coding technique when implementing on hardware.

A coding apparatus according to the present invention includes a data inputting element that inputs data containing a plurality of symbols to be coded, and a frequency counting element that counts an appearance frequency of each dominant symbol candidate previously selected from a set of symbols included in the input data, and a symbol selecting element that selects a dominant symbol from the dominant symbol candidates based upon the appearance frequency. The coding apparatus further includes a fixed code word storing element that stores a fixed code word, the fixed code word being predetermined according to a predicted appearance frequency of the corresponding symbol, a code assigning element that generates a new code word for the dominant symbol and a combined code word of a code word indicating that it is a non-dominant symbol and the fixed code word for a non-dominant symbol, a code word storing element that stores the new code word and the combined code word, a coding element that codes the input data according to the code word and the combined code word and a code outputting element that outputs the coded data.

A decoding apparatus according to the present invention includes a code inputting element that inputs a code data, a code word storing element that stores a code word, a decoding element that decodes the code data based upon the code word, wherein the decoded data includes a plurality of symbols, a frequency counting element that counts an appearance frequency of each dominant symbol candidate previously selected from a set of symbols included in the decoded data and a symbol selecting element that selects a dominant symbol from the dominant symbol candidates based upon the appearance frequency. The decoding apparatus further includes a fixed code word storing element that stores a fixed code word, the fixed code word being predetermined according to a predicted appearance frequency of the corresponding symbol, a code assigning element that generates a new code word for the dominant symbol and assigns to a non-dominant symbol a combined code word of a code word indicating that it is a non-dominant symbol and the fixed code word, and a data outputting element that stores the new code word and the combined code word in the code word storing element and outputs the decoded data.

With any of the above constructions, code quantities are reduced since code words are adaptively updated for the dominant symbols having a large affect on the average code word length. Furthermore, the calculation process can be simplified by reducing the number of counters because only the appearance frequencies of predetermined dominant symbol candidates are calculated.

An aspect of the present invention is that dominant symbol candidates are those symbols predicted as having a high appearance frequency.

Another aspect is that the new code word and the combined code word are one of code table candidates. The code table candidates are at least one of those predicted as having a high appearance frequency and those predicted as having a deterioration in a compression rate when eliminated compared to other candidates.

Another aspect is that the coding element of the coding apparatus may also code an intermediate symbol data and a code table data. An intermediate symbol data specifies the dominant symbol selected in the data selecting element, and the code table data specifies the code word generated in the code assigning element.

The coding performed by the coding element may also be based upon the intermediate symbol data. The coding apparatus may further include an intermediate symbol storing element that stores the intermediate symbol data, the content of the intermediate symbol storing element being set based upon the intermediate symbol.

In yet another aspect of the present invention, the decoding apparatus that decodes code data sent from the coding apparatus that codes the intermediate symbol data and the code table data includes a code data inputting element that inputs a code data, a code word storing element that stores a code word and a decoding element that decodes the code data according to the code word. The code word is set based upon at least one of the decoded code table data and the intermediate symbol data.

With the above construction, the process is simplified since there is no need to generate a code table on the decoding apparatus side. Furthermore, by sending the intermediate symbol data, a fewer number of code tables need to be prepared on the decoding apparatus side. A preset constant may be set as the initial value for the code data in the code word storing element.

In another aspect of the present invention, the decoding apparatus that decodes code data sent from the coding apparatus that codes the intermediate symbol data and the code table data includes a code data inputting element that inputs a code data, a code word storing element that stores a code word, a decoding element that decodes the code data according to the code word and an intermediate symbol storing element that stores an intermediate symbol. The content of the intermediate symbol storing element is set based upon the decoded intermediate symbol data, and the decoding performed by the decoding element is based upon the intermediate symbol data, in addition to the code word.

With this construction as well, the number of code tables to be prepared on the decoding apparatus side can be reduced.

The coding and decoding apparatuses may also be combined to provide a coding-decoding apparatus and coding-decoding methods.

Symbols having frequencies larger than a predetermined threshold value may be selected by the data selecting element as the dominant symbols, according to the result of the frequency counting element.

Additionally, symbols having higher ranks than a predetermined rank when sorted in the descending order of appearance frequency may also be selected as the dominant symbols, according to the result of the frequency counting element. Furthermore, symbols the accumulated frequency value of which is smaller than a predetermined threshold value symbols when sorted in the descending order of appearance frequency may also be selected as the dominant symbols, according to result of the frequency counting element. The coding performed by the code assigning element may be Huffman coding.

In the code assigning element, if there is any fixed code word left which should have been assigned to the dominant symbol, and there is a non-dominant symbol with its length longer than that of the fixed code word, the fixed code word can be temporarily assigned to the non-dominant symbol.

The code word may be generated by the code word assigning element when the appearance frequency of each symbol is out of the range of a predetermined value. The code word generation may also be performed if coding or decoding of a predetermined number of symbols is completed.

If it is predicted that an average length of the code words generated by the code assigning element is longer than the average length of the fixed code words stored in the fixed code word storing element, the fixed code words may be used as the new code words.

A counted value may be initialized in the frequency counting element by multiplying the current counted value by a number not more than 1.

The code words to be stored in the fixed code word storing element may be replaced with new code words generated according to the statistics of the processed data. The code word can be easily generated in the code assigning element by preparing in advance a plurality of appearance probability patterns of the symbols and corresponding code words, and classifying the dominant symbol into one of the patterns.

The dominant symbol may be classified by comparing the appearance probability of the most frequently appearing symbol with a threshold value. The dominant symbol may also be classified according to a result of an operation using frequencies of a plurality of symbols correspondent to predetermined orders, when the dominant symbols are sorted in the frequency order.

The initial value for the code data in the code word storing element may be a preset constant. The initial value for the code data in the code word storing element may also be a code word stored in the fixed code word storing element. The coding-decoding apparatus may also include an intermediate symbol storing element that stores an intermediate symbol data. The content of the intermediate symbol storing element is set based upon intermediate symbol data selected by the data selecting element or the decoded intermediate symbol data. The coding and decoding may be based upon the intermediate symbol data in addition to the code word.

BRIEF DESCRIPTION OF THE DRAWINGS

The accompanying drawings, which are incorporated in and constitute a part of this specification, illustrate embodiments of the present invention and, together with the description, serve to explain the advantages and principles of the invention. In the drawings:

FIGS. 4(a) through 4(d) show concepts of each data according to the second embodiment of the present invention;

FIG. 5 shows an example of internal data within an intermediate symbol memory of the coding apparatus according to the second embodiment of the present invention;

FIG. 8 shows an example of a conventional Huffman code;

DETAILED DESCRIPTION OF THE PREFERRED EMBODIMENTS

Co-Assigned U.S. patent application Ser. No. 09/058,355, filed Apr. 10, 1998 and entitled "Coding Apparatus, Decoding Apparatus, Coding-Decoding Apparatus and Methods Applied Thereto", is incorporated by reference herein in its entirety, and is referred to as the "related art" hereinafter. That invention discloses apparatuses and methods that easily generates an adaptive Huffman code.

First Embodiment

In the related art cited above, it was necessary to know the appearance probability of all of the symbols for the selecting of dominant symbols and the generation of Huffman codes. Although this is not a problem when the related art is implemented on software, it may be a problem when implementing on hardware, in which resources are limited, especially when there is a large number of symbols each requiring a counter.

In the related art, there were no assumptions made upon the characteristics of input data. In reality, however, there are cases when the characteristics of the input data are already known. When the input data is an English alphabet, the letters "a", "e", "s" can be expected to appear more frequently than the letters "q", "v", "x", for example. This signifies that the former letters are more likely to be selected as a dominant symbol.

Therefore, the first embodiment of the present invention classifies the symbols into dominant symbol candidates and non-candidate symbols. The non-candidate symbols are never selected as dominant symbols, and their appearance probabilities are not individually counted. On the other hand, the appearance probabilities of the dominant symbol candidates are counted as in the related art, and the dominant symbols are selected among them. A new code table is generated based upon the selected dominant symbols, the "others" consisting of the non-candidate symbols and the dominant symbol candidates that were not selected as dominant symbols. The generation of the code table is similar to that in the related art and is not discussed here in detail.

Figure 1:
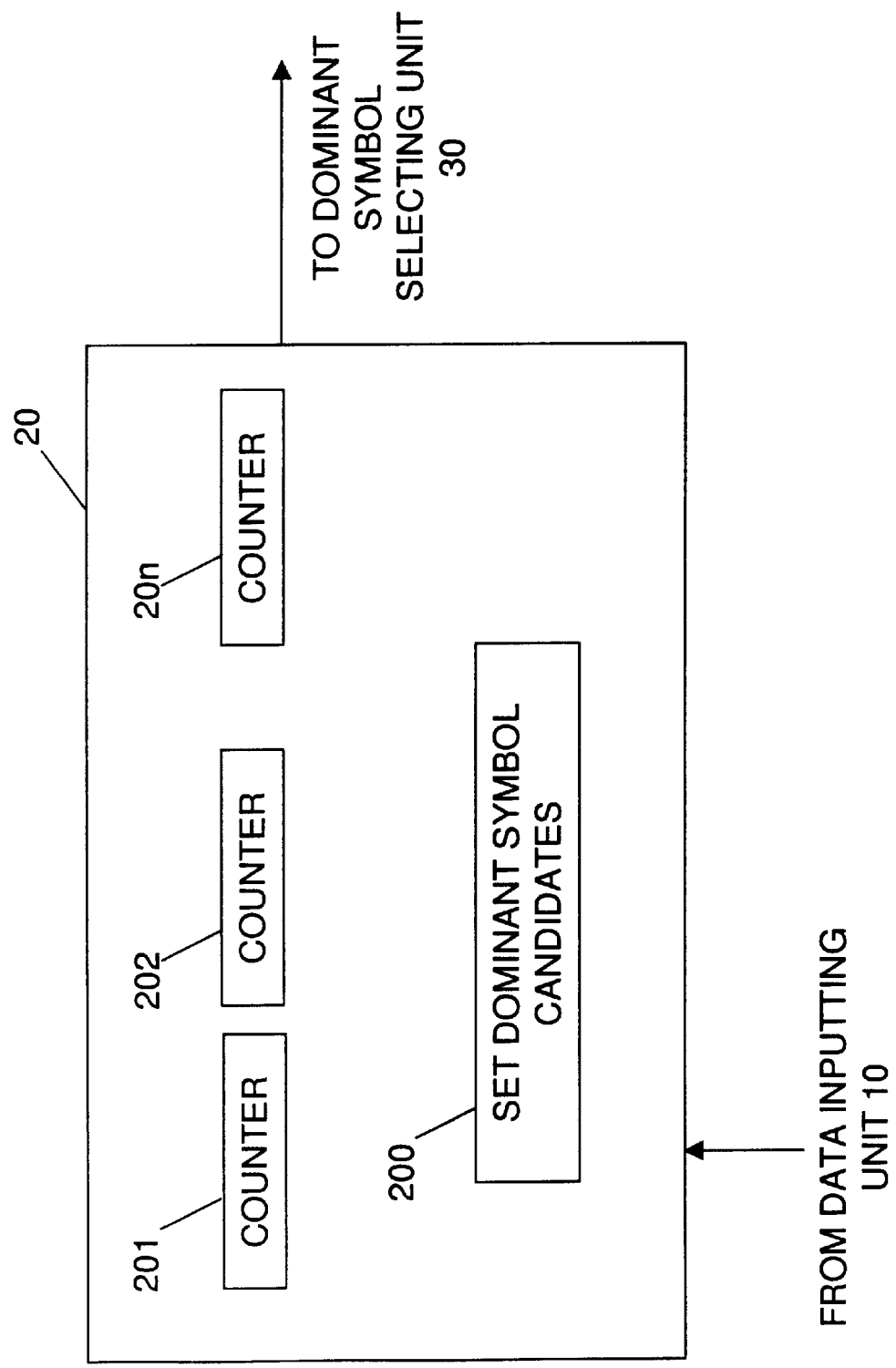
FIG. 1 shows the principal part of a coding apparatus according to a first embodiment of the present invention.

As shown in FIG. 1, hardware counters 201, 202, . . . 20n are set in the frequency counting unit 20. A dominant symbol candidate setting unit 200 sets the symbols to be calculated in the counters 201, 202, . . . 20n.

In this embodiment, calculating the appearance probability of every symbol is equivalent to assuming that dominant symbols will not be selected from the non-candidate symbols. In reality, such an assumption does not always hold true since there are variations in the distribution of the appearance probabilities. If, however, this assumption holds true at a probability of a certain extent, it becomes possible to prevent the deterioration of the compression rate. The merit brought about with the elimination of counters correspondent to non-candidate symbols is quite big compared to the small risk of the above assumption not being correct.

Code trees can similarly be eliminated. In the second embodiment of the related art, every possible code tree of each number of dominant symbols is considered as a candidate, and code tables are generated according to a preset judgement standard. However, the appearance probability of some code trees are very low. For example, if the threshold value of the dominant symbol is ⅛, it is almost impossible, though theoretically possible, for 7 dominant symbols to exist. Therefore, when the apparatus scale is limited, the demerit caused by the increase in the apparatus scale is bigger than the merit brought about by generating code tables of the seven dominant symbols and improving the compression rate.

Hence, the first embodiment of the present invention reduces code tree candidates as well. It is possible to experimentally eliminate the code trees with a low appearance probability, for example. If a dominant symbol that is correspondent to the eliminated code tree is obtained, a neighboring code tree may serve as a substitute. In the above example, when a code tree for only 5 dominant symbols is prepared and more than 6 dominant symbols are obtained, the prepared code tree can be used as a substitute. In this way, the selecting process of code trees in the second embodiment of the related art can be simplified, and the number of patterns stored in the code assigning unit can be reduced. As a variation in the selecting of code tree candidates, those code trees that are expected to have only a small influence upon the compression rate when they are eliminated may be replaced with another code tree. For example, when two of each code tree for 2 dominant symbols and 3 dominant symbols exist, there is expected to be less deterioration of the compression rate to eliminate one of each type of code tree, rather than to eliminate the two code trees for 2 dominant symbols.

The construction and the operations of the coding apparatus according to the first embodiment of the present invention can easily be analogized from the related art, and therefore are not discussed here in detail. Here, an effect of this embodiment is shown by an experiment that applies the method suggested in this embodiment to image data coding. The image data coding performed here is a combination of prediction coding and run length coding, and the method of this embodiment is applied to the Huffman coding performed on the run length.

This image coding has a run length of 1 to 500. Symbols with a run length from 1 through 8 are considered as dominant symbol candidates and those with a run length of 9 and over are set as non-candidate symbols. Since the number of dominant symbols may vary from 0 to 7, the theoretical number of types of code trees is 11. Here, however, the 4 code trees correspondent to cases where the number of dominant symbols is 0 to 2 are considered as candidates. Therefore, if the number of dominant symbols is more than 3, the 2 most frequently appearing symbols are selected and the correspondent code tree is used.

According to this embodiment, coding and decoding apparatuses can be simplified since candidates of dominant symbols can be narrowed down beforehand.

Figure 2:
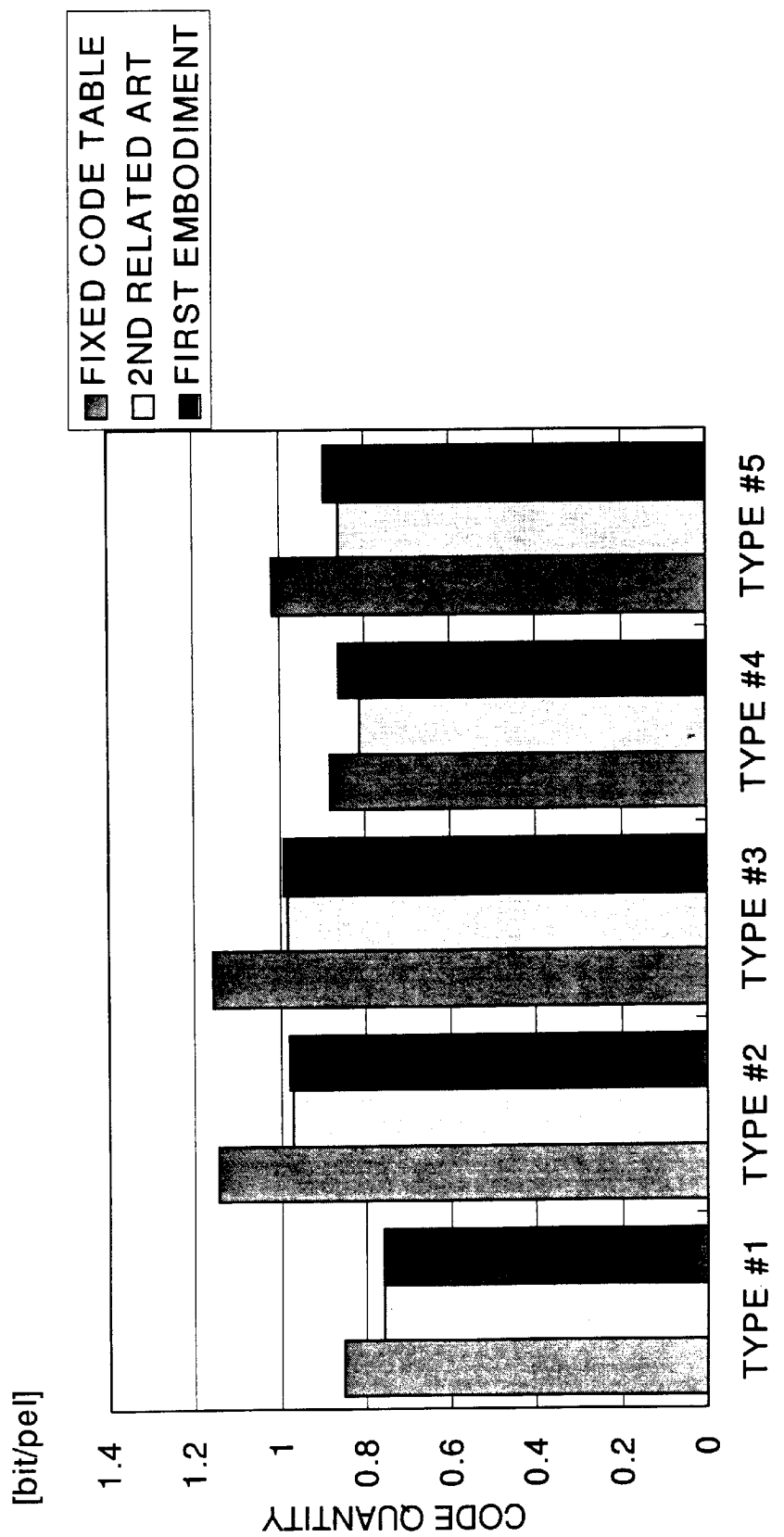
FIG. 2 shows an example of a result of an experiment performed by the coding apparatus according to the first embodiment of the present invention.

FIG. 2 shows a comparison between the code quantities of a fixed code table, that of the second embodiment of the related art and that of this embodiment according to the present invention when coding five different types of image data. The effect of this embodiment can be clearly seen from the chart.

Second Embodiment

The second embodiment of the present invention provides a simplified decoding apparatus in particular, and has two main features.

One feature of this embodiment is that it embeds the used code table or its identification number in the code data. In the related art and the first embodiment of the present invention, the decoding apparatus simulates the code table generation of the coding apparatus to perform a decoding process that corresponds to a changing code table. However, in reality, only the coding apparatus needs to generate a code table because the decoding apparatus only needs to know the code table that has been used. In addition, it is difficult to correspond to changes in the code table generating process of the coding apparatus. With this embodiment, it becomes possible to correspond to a plurality of coding apparatuses generating code tables with differing algorithms with one decoding apparatus.

The second feature of this embodiment is that an abstract intermediate symbol is placed between the codes and the code tables. In the code tables discussed in the related art and the first embodiment of the present invention, it was assumed that the symbols and the code data correspond to each other, one to one. This means that even when there is only one dominant symbol and accordingly one type of code tree, code tables of the same number as the symbols is needed since it is possible for all of the symbols to be dominant symbols. This may be a critical factor when implementing on hardware.

In this embodiment, the result of decoding the code table is an intermediate symbol that shows to which dominant symbol it corresponds. Then, the intermediate symbol is decoded to obtain the corresponding original input data. The code table only needs to provide the intermediate symbol, meaning if there is one code tree, one code table will suffice. Hence, it is possible to reduce the apparatus scale. This feature will prove as effective when applied to a coding apparatus.

If the second feature is combined with the first feature, not only the code tables but also the relationship between the intermediate symbols and the dominant symbols are embedded in the code data.

Figure 3:
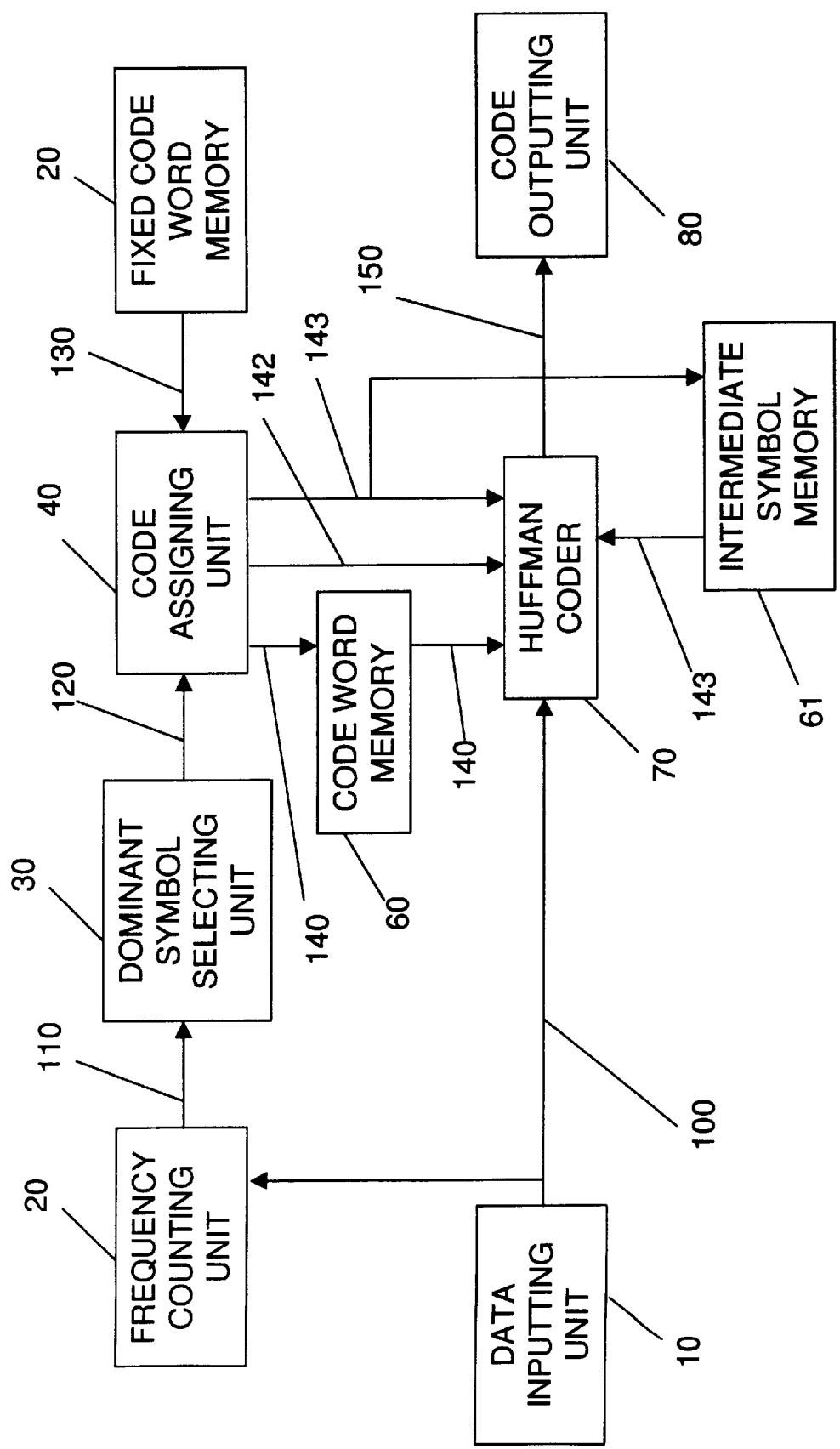
FIG. 3 is an exemplary block diagram showing a coding apparatus according to a second embodiment of the present invention.
Figure 6:
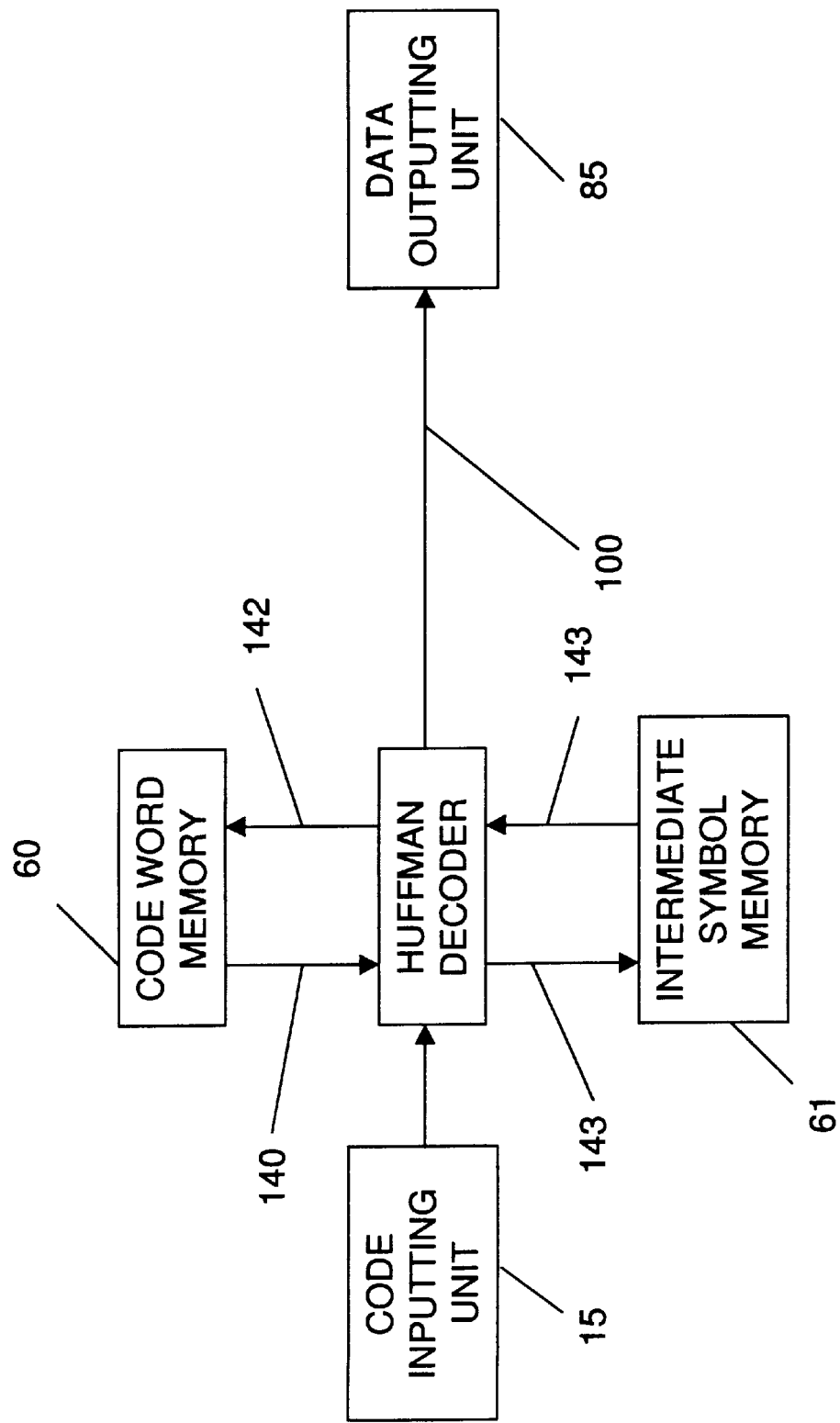
FIG. 6 is an exemplary block diagram showing a decoding apparatus according to the second embodiment of the present invention.

FIGS. 3 and 6 respectively show a coding apparatus and a decoding apparatus according to the second embodiment. The parts similar to those in FIGS. 1 and 4 of the related art have the same reference numbers and perform the same functions, and therefore are not discussed here in detail. In FIG. 3, only the parts differing from those of the coding apparatus of the first prior art are discussed here.

As shown in FIG. 3, a code assigning unit 40, in addition to the operations in the first embodiment of the related art, sends a code table data 142 to a Huffman coder 70. The code assigning unit 40 also sends an intermediate symbol data 143, which shows the dominant symbol selected from the generated code table, to the Huffman coder 70 and an intermediate symbol memory 61. The intermediate symbol memory 61 stores the intermediate symbol data 143 and sends it to the Huffman coder 70. The Huffman coder 70 uses a code word data 140 to perform Huffman coding upon the code table data 142 and the intermediate symbol data 143, and the intermediate symbol data 143 to code the input data 100. It then sends the result to a code data output unit 80 as a code data 151.

The operation of the Huffman coder 70 differs from that in the related art and the first embodiment of the present invention. The code word data 140 needs to include not only the input data 100, but also the code word data correspondent to the values of both the code table data 142 and the intermediate symbol data 143. The Huffman coder 70 codes the code table data 142 and the intermediate symbol data 143 based upon the code word data 140. Coding of these data is performed when the code table is updated in the code assigning unit 40.

Figure 4A:
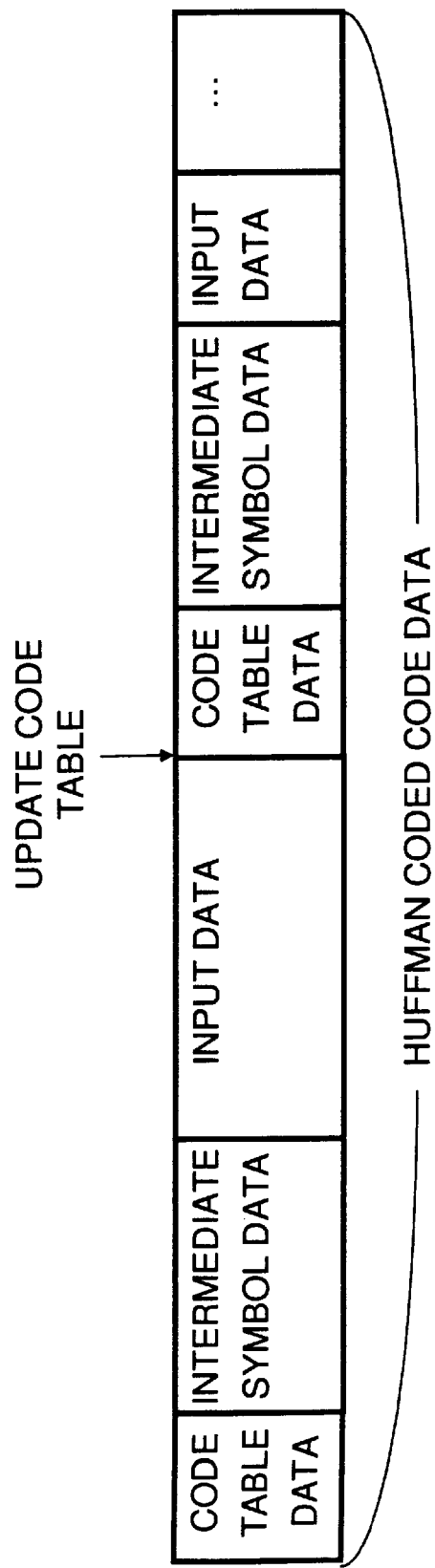

FIGS. 4(a) and 4(b) respectively are conceptual diagrams of the code data 150 and the code table data 142. In FIG. 4(b), input 1 through input N are input symbols included in the input data 100. Here, the code table data 142 specifies a particular code table with a corresponding number. Code words may also be entirely or partially embedded in the code data. As shown with code table data 2 in FIG. 4(b), it is possible for code tables with few dominant symbols to not have a code being assigned to the intermediate symbol of the latter half.

FIGS. 4(c) and 4(d) are conceptual diagrams of the intermediate symbol data 143. The format shown here directly specifies the input data correspondent to the intermediate symbol. Here again, a particular combination may be expressed with a corresponding number. In FIG. 4(c) shows a format in which the length of intermediate symbol data changes according to how many intermediate data a code table data corresponds, and the number of intermediate symbols is fixed as 3 for illustration purposes. It is also possible to fix the number of intermediate symbols to simplify the process, as illustrated in FIG. 4(d). In such a case, dummy intermediate symbols are embedded in code table data having a small number of intermediate symbols.

In a format where the code table data and the intermediate symbol data are always a set, the position of the intermediate symbols can be specified. Therefore, the code given to an intermediate symbol data may overlap with that given to the input symbol or the code table data. The code table may also be conversely constructed so that the code words given to the input symbol, code table data and intermediate symbol data do not overlap with each other. In such a case, data order is arbitrary and the format as illustrated in FIG. 4(a) is not necessary.

The coding of input data 100 is now discussed in detail. The Huffman coder 70 compares the input data 100 with the intermediate symbol memory 61. If the input data 100 is a dominant symbol, the code data of the corresponding intermediate symbol is read from the code word memory 60 and becomes the code data. If the input data 100 is not a dominant symbol, the corresponding code data is read from the code word memory 60 and becomes the code data. The format of the internal data of the code word memory 60 is a line under "corresponding code table" illustrated in FIG. 4(b), for example. An example of a format of the data within the intermediate symbol memory 61 is illustrated in FIG. 5.

Figure 9:
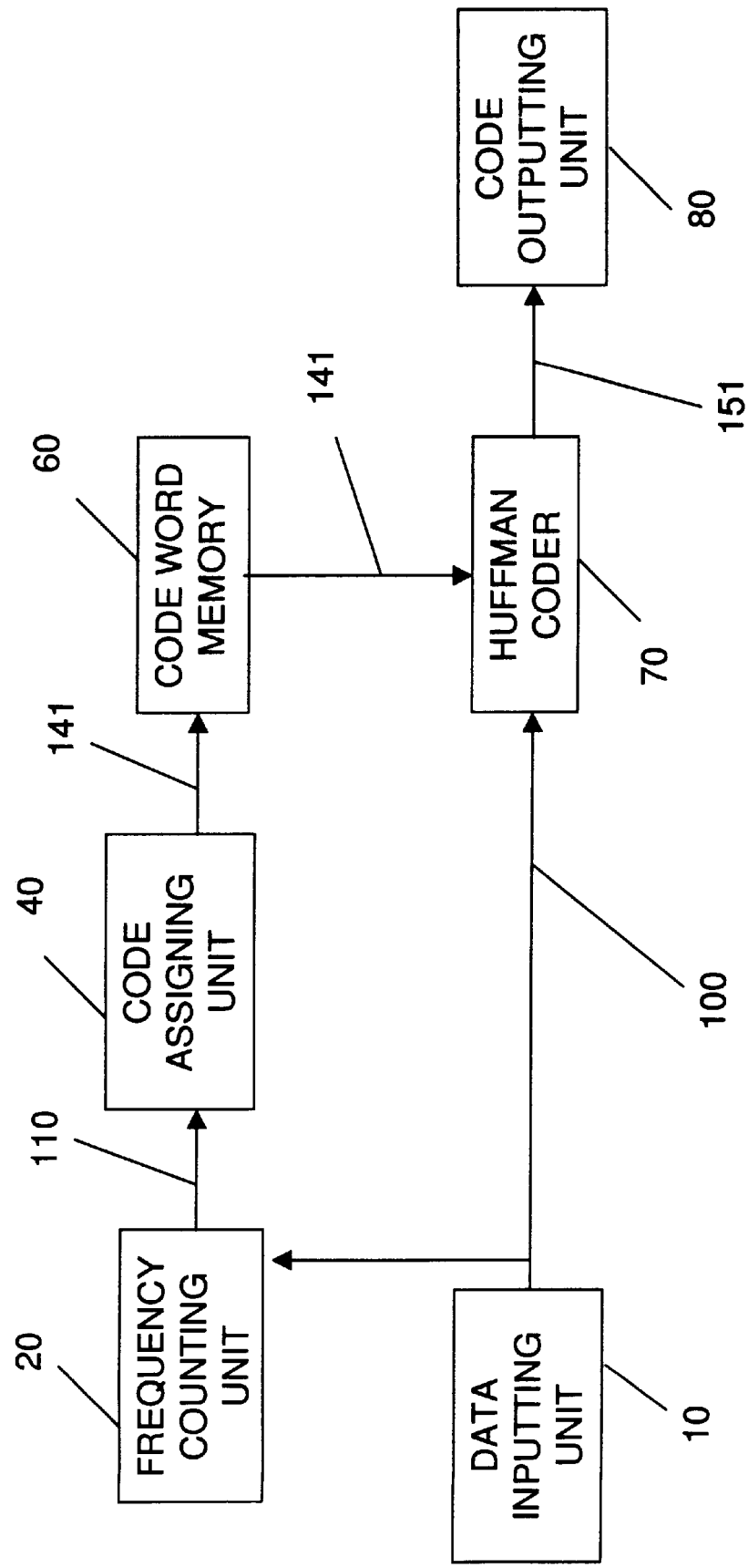
FIG. 9 is a block diagram showing the construction of a coding apparatus according to a prior art apparatus.
Figure 10:
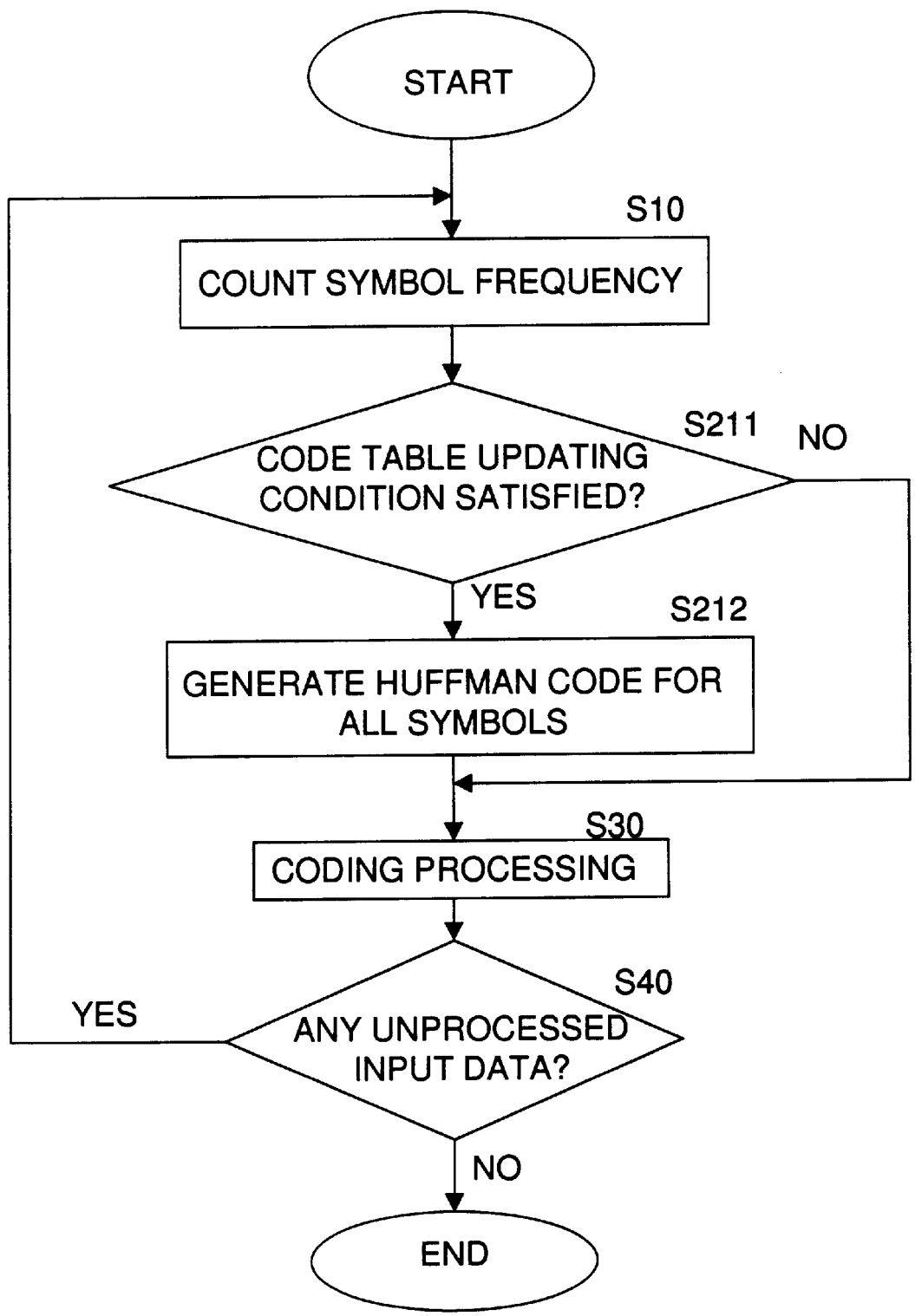
FIG. 10 is a flow chart showing an example of a coding operation in the coding apparatus of FIG. 9.
Figure 11:
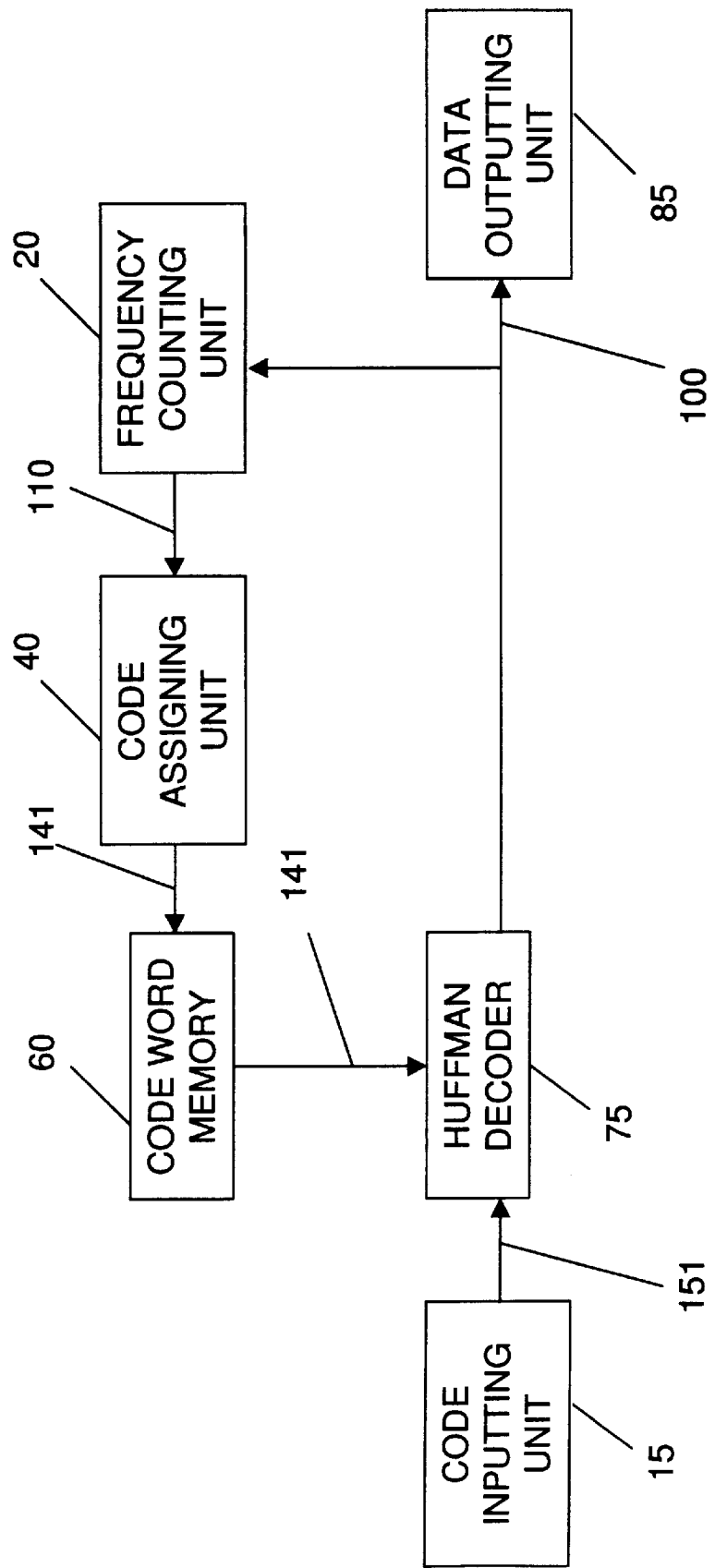
FIG. 11 is a block diagram showing the construction of a decoding apparatus according to a prior art apparatus.
Figure 12:
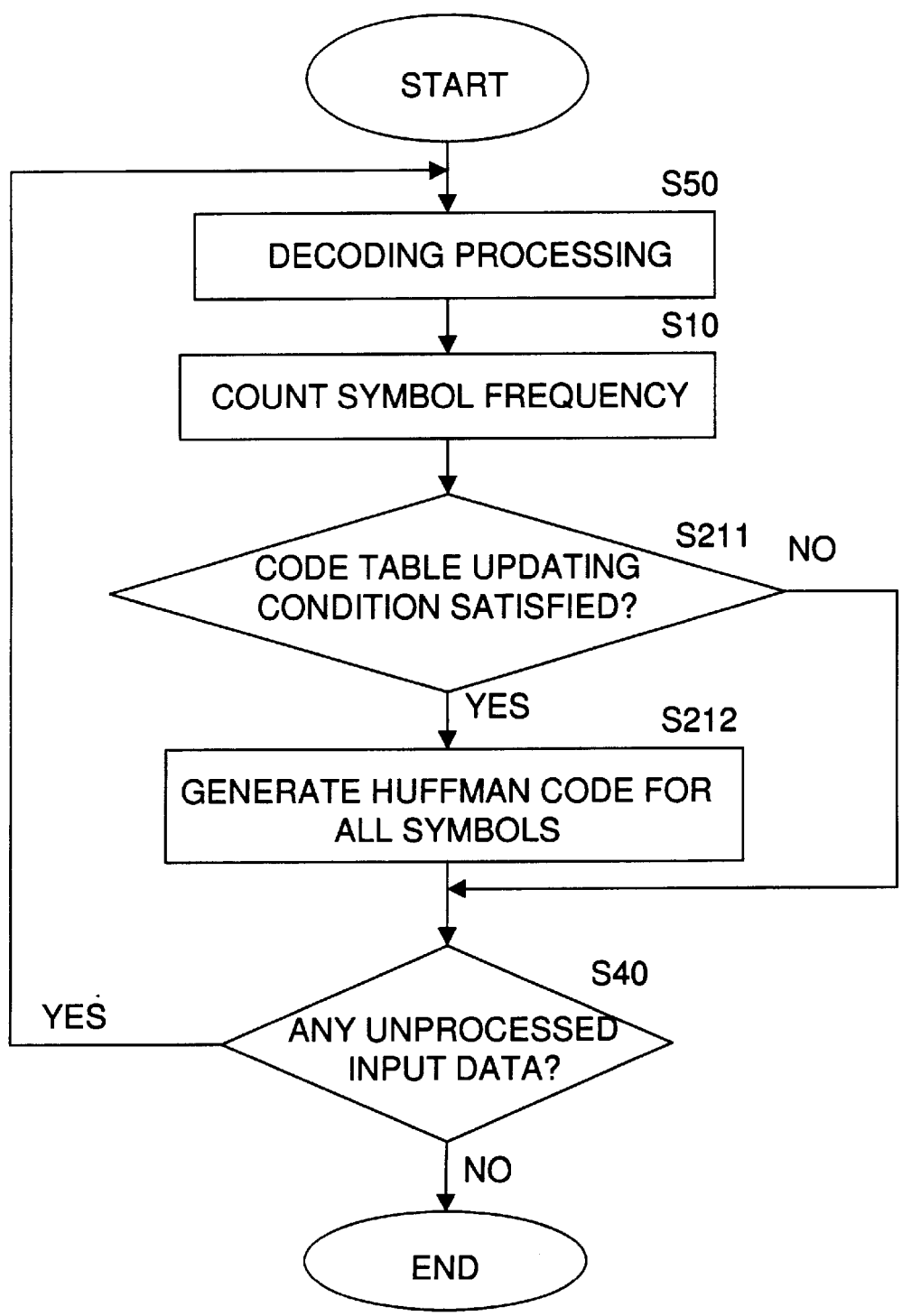
FIG. 12 is a flow chart showing an example of a decoding operation in the decoding apparatus of FIG. 11.

FIG. 6 shows a construction of a decoding apparatus according to the second embodiment. Only the parts differing from those of the coding apparatuses illustrated in FIG. 9 and FIG. 3 are discussed here in detail. As shown in FIG. 6, a Huffman decoder 75 uses the intermediate symbol data 143 and the code word data 140 to perform Huffman decoding upon code data 150. It then sends the resulting code table data 142, intermediate symbol data 143 and input data 100 to the code word memory 60, the intermediate symbol memory 61 and a data output unit 85, respectively.

Figure 7:
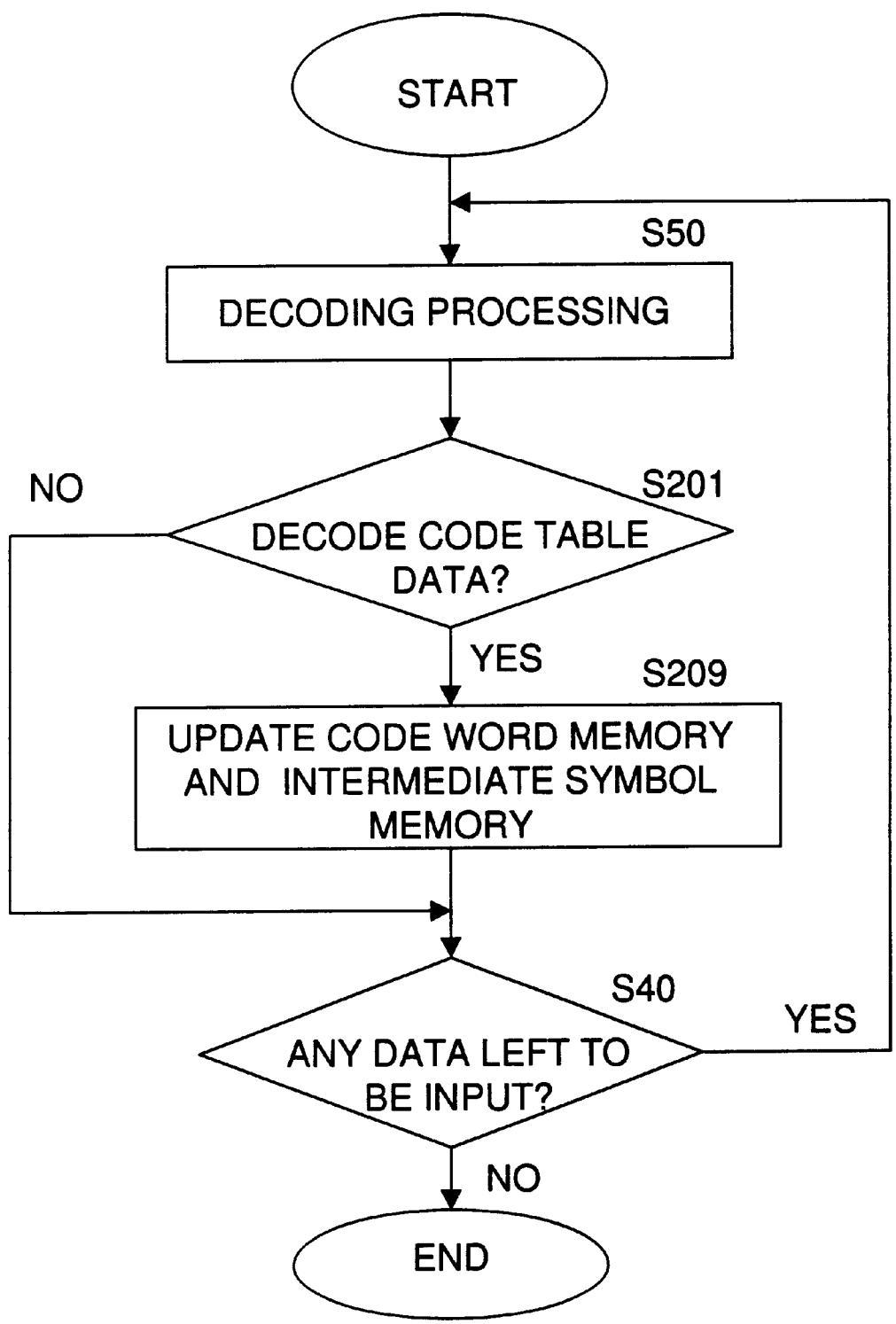
FIG. 7 is a flow chart illustrating a decoding process performed by the decoding apparatus according to the second embodiment of the present invention.

FIG. 7 is a flow chart illustrating the operations of the decoding apparatus of the second embodiment. Again, only the parts differing from the previously discussed apparatuses are discussed here.

As shown in FIG. 7, in step 201, if the result of the decoding process performed in step 50 by the Huffman decoder 75 is a code table data, the process proceeds to step 209, and to step 40 if not. In step 209, the data within the code word memory 60 is updated into a new code table based upon the code table data. Then, the intermediate symbol data 143 is decoded from the code data 150, and the data within the dominant symbol memory 61 is updated based upon the intermediate symbol data 143.

Here, it is assumed that a intermediate symbol data is embedded directly after the code table data in the code data 150, as illustrated in FIG. 4(a).

According to the second embodiment of the present invention, the decoding apparatus can be simplified since the code table updating information is embedded in the code data. Furthermore, by replacing the data within the code table with an intermediate symbol instead of a dominant symbol itself, it is possible to simplify both the coding and decoding apparatuses.

As shown in FIGS. 3 and 6, the method of this invention is preferably implemented on a programmed processor. However, the image processing apparatus can also be implemented on a general purpose or special purpose computer, a programmed microprocessor or micro controller and peripheral integrated circuit elements, an ASIC or other integrated circuit, a hardware electronic or logic circuit such as a discrete element circuit, a programmable logic device such as a PLD, PLA, FPGA or PAL, or the like. In general, any device on which a finite state machine capable of implementing the flowchart shown in FIG. 7 can be used to implement the image processing functions of this invention. Furthermore, the elements of FIGS. 3 and 6 may be embodied in hardware, software or a combination of hardware and software.

While this invention has been described with specific embodiments thereof, it is evident that many alternatives, modifications, and variations will be apparent to those skilled in the art. Accordingly, the preferred embodiments of the invention as set forth herein are intended to be illustrative, not limiting. Various changes may be made without departing from the spirit and scope of the invention.

What is claimed is:

1. A coding apparatus comprising:
    a data inputting element that inputs data containing a plurality of symbols to be coded;
    a frequency counting element that counts an appearance frequency of each dominant symbol candidate previously selected from a set of symbols included in the input data;
    a symbol selecting element that selects a dominant symbol from the dominant symbol candidates based upon the appearance frequency;
    a fixed code word storing element that stores a fixed code word, the fixed code word being predetermined according to a predicted appearance frequency of the corresponding symbol;
    a code assigning element that generates a new code word for the dominant symbol and a combined code word of a code word indicating that it is a non-dominant symbol and the fixed code word for a non-dominant symbol;
    a code word storing element that stores the new code word and the combined code word;
    a coding element that codes the input data according to t he code word and the combined code word; and
    a code outputting element that outputs the coded data.

2. The coding apparatus as set forth in claim 1, wherein the dominant symbol candidate is a symbol predicted as having a high appearance frequency.

3. The coding apparatus as set forth in claim 1, wherein the new code word and the combined code word are one of a code table candidate.

4. The coding apparatus as set forth in claim 3, wherein the code table candidate is at least one of a type predicted as having a high appearance frequency and a type predicted as having a deterioration in a compression rate when eliminated compared to other candidates.

5. The coding apparatus as set forth in claim 1, wherein the coding element codes an intermediate symbol data that specifies the selected dominant symbol.

6. The coding apparatus as set forth in claim 1, wherein the coding element codes a code table data that specifies the code word or the combined code word.

7. The coding apparatus as set forth in claim 1, further comprising an intermediate symbol storing element that stores the intermediate symbol data, the content of the intermediate symbol storing element being set based upon the intermediate symbol.

8. The coding apparatus as set forth in claim 1, wherein the coding performed by the coding element is also based upon the intermediate symbol data.

9. A decoding apparatus comprising;
    a code data inputting element that inputs a code data coded by the coding apparatus as set forth in claim 5;
    a code word storing element that stores a code word; and
    a decoding element that decodes the code data according to the code word.

10. The decoding apparatus as set forth in claim 9, wherein the code word is set based upon at least one of the decoded code table data and the intermediate symbol data.

11. The decoding apparatus as set forth in claim 10, wherein a constant is set as an initial value for the code word.

12. A decoding apparatus comprising;
    a code data inputting element that inputs a code data coded by the coding apparatus as set forth in claim 5;
    a code word storing element that stores a code word;
    a decoding element that decodes the code data according to the code word; and
    an intermediate symbol storing element that stores an intermediate symbol.

13. A decoding apparatus as set forth in claim 12, wherein the content of the intermediate symbol storing element is set based upon the decoded intermediate symbol data, and the decoding performed by the decoding element is based upon the intermediate symbol data, in addition to the code word.

14. A decoding apparatus comprising:
    a code inputting element that inputs a code data;
    a code word storing element that stores a code word;
    a decoding element that decodes the code data based upon the code word, wherein the decoded data includes a plurality of symbols;
    a frequency counting element that counts an appearance frequency of each dominant symbol candidate previously selected from a set of symbols included in the decoded data;
    a symbol selecting element that selects a dominant symbol from the dominant symbol candidates based upon the appearance frequency;
    a fixed code word storing element that stores a fixed code word, the fixed code word being predetermined according to a predicted appearance frequency of the corresponding symbol;
    a code assigning element that generates a new code word for the dominant symbol and assigns to a non-dominant symbol a combined code word of a code word indicating that it is a non-dominant symbol and the fixed code word; and
    a data outputting element that stores the new code word and the combined code word in the code word storing element and outputs the decoded data.

* * * * *